US009803285B1

(12) United States Patent
Robinson et al.

(10) Patent No.: US 9,803,285 B1
(45) Date of Patent: Oct. 31, 2017

(54) ELECTROLESS ATOMIC LAYER DEPOSITION

(71) Applicant: National Technology & Engineering Solutions of Sandia, LLC, Albuquerque, NM (US)

(72) Inventors: David Bruce Robinson, Hayward, CA (US); Patrick J. Cappillino, Fremont, CA (US); Leah B. Sheridan, Knoxville, TN (US); John L. Stickney, Athens, GA (US); David M. Benson, Athens, GA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 654 days.

(21) Appl. No.: 14/189,866

(22) Filed: Feb. 25, 2014

Related U.S. Application Data

(60) Provisional application No. 61/778,153, filed on Mar. 12, 2013.

(51) Int. Cl.
| | |
|---|---|
| *C23C 8/02* | (2006.01) |
| *C23C 8/06* | (2006.01) |
| *C23C 22/78* | (2006.01) |
| *C23C 18/44* | (2006.01) |
| *C23C 28/00* | (2006.01) |
| *C23C 18/18* | (2006.01) |
| *C23C 16/02* | (2006.01) |

(52) U.S. Cl.
CPC ........... *C23C 28/00* (2013.01); *C23C 8/02* (2013.01); *C23C 8/06* (2013.01); *C23C 16/02* (2013.01); *C23C 18/1834* (2013.01); *C23C 18/44* (2013.01)

(58) Field of Classification Search
CPC ............ C23C 18/1682; C23C 18/1827; C23C 18/1824; C23C 18/1831; C23C 18/1834
USPC .......................................................... 205/85
See application file for complete search history.

(56) References Cited

U.S. PATENT DOCUMENTS

| 7,507,495 B2 | 3/2009 | Wang et al. | |
| 2005/0169807 A1* | 8/2005 | Carpenter | G01N 21/783 436/144 |

OTHER PUBLICATIONS

Kim et al "Platinum Nanofilm Formation by EC-ALE via Redox Replacement of UPD Copper: Studies Using in-Situ Scanning Tunneling Microscopy" J. Phys. Chem. B., 2006, 110, p. 17998-18006.*
Fabre, Bruno, et al., "Electroless Patterned Assembly of Nanoparticles on Hydrogen-Terminated Silicon Surfaces for Applications in Photoelectrocatalysis," *ACS Appl. Mater. Interfaces 5* (2013), pp. 338-343, 6 pages.

(Continued)

*Primary Examiner* — Brian W Cohen
(74) *Attorney, Agent, or Firm* — Blakely, Sokoloff, Taylor & Zafman, LLP

(57) ABSTRACT

A method of electroless atomic layer deposition is described. The method electrolessly generates a layer of sacrificial material on a surface of a first material. The method adds doses of a solution of a second material to the substrate. The method performs a galvanic exchange reaction to oxidize away the layer of the sacrificial material and deposit a layer of the second material on the surface of the first material. The method can be repeated for a plurality of iterations in order to deposit a desired thickness of the second material on the surface of the first material.

8 Claims, 13 Drawing Sheets

(56) References Cited

OTHER PUBLICATIONS

Zolfaghari, Alireza, et al., "Electroless Deposition of Pt at a Pd Electrode by Reaction with Sorbed H in Pd/H," *Journal of Electroanalytical Chemistry 488* (May 2000), pp. 151-153, 3 pages.
Cappillino et al., "Atomic-Layer Electroless Deposition: A Scalable Approach to Surface-Modified Metal Powders," Langmuir 2014, vol. 30, pp. 4820-4829.

* cited by examiner

ELECTROLESS ATOMIC LAYER DEPOSITION

CROSS-REFERENCE TO RELATED APPLICATION

This application claims the benefit of the earlier filing date of U.S. Provisional Patent Application No. 61/778,153, filed Mar. 12, 2013, entitled "Electroless Atomic Layer Deposition." The aforementioned application is hereby incorporated by reference, in its entirety, for all purposes.

STATEMENT OF GOVERNMENT RIGHTS

This invention was developed under Contract DE-AC04-94AL85000 between Sandia Corporation and the U.S. Department of Energy. The U.S. Government has certain rights in this invention.

FIELD

The present invention relates to thin film deposition techniques and in particular to atomic layer deposition.

BACKGROUND

A thin film is a layer of material ranging from fractions of a nanometer (monolayer) to several micrometers in thickness. Electronic semiconductor devices, magnetic devices, and optical coatings are major applications benefiting from thin-film construction. Atomic layer deposition (ALD) is a thin film deposition technique that is based on the sequential use of a gas phase chemical process. ALD is a self-limiting (the amount of film material deposited in each reaction cycle is constant), sequential surface chemistry that deposits conformal thin-films of materials onto substrates of varying compositions. Due to the characteristics of self-limiting and surface reactions, ALD film growth enables control of thickness of deposited layers at the atomic scale.

Noble metals such as Palladium (Pd) have applications in an array of fields, including hydrogen storage and sensing, chemical catalysis, electrical energy storage, and fuel cells. In each of these areas, formation of surface and subsurface alloys has been identified as a promising avenue for enhancement of properties of the metal. In the case of hydrogen storage and sensing, computational investigations suggest that modulation of surface hydride energetics resulting from the over layer could lead to enhanced kinetics of hydrogen absorption and desorption.

Electrochemical atomic layer deposition involves repetition of a two-step process that, in the first step, exploits the fact that some materials electrodeposit as a monolayer onto a dissimilar substrate at a less negative potential than they would deposit onto themselves. In the second step, a galvanic exchange reaction replaces the sacrificial layer formed in the first step with a material upon which the first step can be repeated. It is typically done in an electrochemical flow cell. When scaled up for substrates with large surface areas, large electrical current sources are required.

In the past decades, several strategies for atomic layer deposition have evolved. However, those strategies for ALD either apply to a limited range of materials, require elevated temperatures or highly reactive precursors that can damage substrates, cannot easily be brought into electrical contact, and/or are not scalable because they require instrumentation that generates an electrical current proportional to the substrate surface area.

Electroless deposition is a method that enables thin film growth under mild conditions on substrates to which electrical current is not easily supplied. This method usually involves a second chemical agent that donates or accepts electrons from the species being deposited. Electroless deposition does not involve a mechanism to constrain growth to one atomic layer at a time. Galvanic exchange, also known as galvanic displacement, galvanic replacement, or redox replacement, is a type of electroless deposition in which the substrate serves as the second chemical agent, typically being oxidized as the desired material is deposited. Except when this is used as a step in electrochemical atomic layer deposition (where a sacrificial atomic layer is first electrodeposited), a galvanic exchange reaction is not limited to an atomic thickness; its extent is limited by a balance between corrosion and passivation of the substrate.

SUMMARY

A method of electroless atomic layer deposition is described. In an exemplary embodiment, the method generates a layer of sacrificial material on a surface of a first material by a chemical reaction that does not require application of electrical current from an external circuit. The method adds doses of a solution of a second material to the sample. The method performs a galvanic exchange reaction to oxidize away the layer of the sacrificial material and deposit a layer of the second material on the surface of the first material. In one embodiment, the electroless generation of the layer of the sacrificial material, the addition of the second material, and the performance of the galvanic exchange reaction are repeated for a plurality of iterations in order to deposit a desired thickness of the second material on the surface of the first material.

In one embodiment, the layer of the sacrificial material is generated without using an external electrical power supply. In one embodiment, the thickness of the layer of the sacrificial material is on an order of an atomic thickness. In one embodiment, the electroless atomic layer deposition is performed in a liquid or similar condensed phase and at room temperature.

In one embodiment, in order to electrolessly generate the layer of the sacrificial material, the method bubbles a mixture of dilute $H_2$ in a nonreactive gas (e.g., $N_2$) into an electrolyte and forms a layer of hydride on the surface of the first material. In one embodiment, the percentage of $H_2$ in $N_2$ ranges from 0.01% to 2.5%. In one embodiment, the first material is palladium and the second material is rhodium, and the solution of the second material contains rhodium(III) chloride.

In one embodiment, in order to electrolessly generate the layer of the sacrificial material, the method adds a mixture of ferrocyanide and ferricyanide into electrolyte, adds copper salt into the electrolyte, and forms a layer of copper on the surface of the first material. In one embodiment, the ratio of ferrocyanide to ferricyanide is adjusted to establish a voltage for depositing the layer of copper. In one embodiment, in order to electrolessly generate the layer of the sacrificial material, the method performs a reaction of solution-phase borohydride with the surface of the first material to form a surface hydride layer.

A chemical reactor for performing electroless atomic layer deposition is described. In an exemplary embodiment, the chemical reactor includes a container for containing electrolyte and a first metal material, a test electrode in contact with the electrolyte to monitor an open circuit voltage within the chemical reactor, a gas bubbler for bubbling dilute hydrogen gas to react with the surface of the first metal material, and a reference electrode for providing a reference voltage for the test electrode.

In one embodiment, the reaction between the hydrogen gas and the surface of the first metal material forms a hydride layer on the surface of the first metal material and changes the open circuit voltage. The open circuit voltage is monitored to determine whether the reaction between the hydrogen gas and the surface of the first metal material has completed. In one embodiment, the hydride layer is formed without using an external electrical power supply.

In one embodiment, a salt of a second metal material is added into the electrolyte once the reaction between the hydrogen gas and the surface of the first metal material has completed. The salt of the second metal material reacts with the hydride layer to replace the hydride layer with a layer of the second metal material on the surface of the first metal material. The open circuit voltage is monitored to determine whether the reaction between the hydride layer and the salt of the second metal material has completed. In one embodiment, the first metal material is palladium and the second metal material is rhodium, and the salt of the second metal material is rhodium(III) chloride.

BRIEF DESCRIPTION OF THE DRAWINGS

The invention may best be understood by referring to the following description and accompanying drawings that are used to illustrate embodiments of the invention. In the drawings.

DETAILED DESCRIPTION

A method for controllable electroless growth of layers of one material on another material is described. In one embodiment, the method deposits a single layer of material that is one atom thick onto a substrate of another material. In another embodiment, the thickness of the deposited single layer of material is very close to one atom thick. In one embodiment, the method forms a surface hydride by electroless (chemical) deposition, and the hydride is then displaced by a nobler element in a surface-limited reaction. The method can iterate the process and grow multiple layers of materials. In one embodiment, the method is used to modify the chemical reactivity on a metal surface.

In one embodiment, the surface hydride can be formed chemically, such as by exposure to $H_2$ gas or a hydride-containing reducing agent. Therefore, the electrochemical instrumentation (if any) need not scale with the substrate size, and electrical contact to the substrate is not required. The displacing element can be potentiometrically titrated, so no reactant and minimal byproducts are left over, allowing growth in a batch reactor with a static volume. So the waste stream does not scale with sample size or film thickness, as it would with a flow cell. While this method primarily focuses on catalytic noble metal films and sensors, one with ordinary skill in the art would recognize that this can be a widely applicable approach to the large-scale preparation of crystalline materials that have precisely defined nanoscale structures, because of the enhanced mechanical, electrical, thermal, optical, or other properties that are predicted to result from this.

Figure 1:
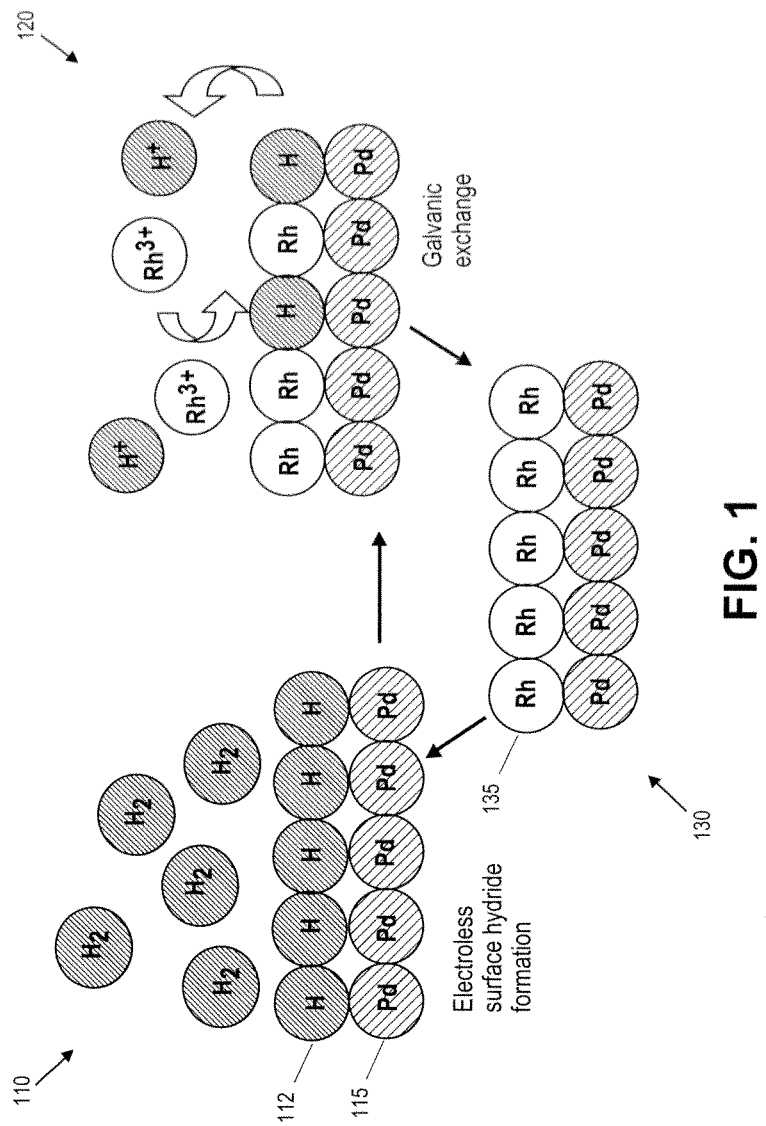
FIG. 1 illustrates performing electroless atomic layer deposition in accordance with one embodiment of the present invention.

FIG. 1 illustrates performing electroless ALD in accordance with one embodiment of the present invention. Specifically, the concept is illustrated through three stages 110, 120, and 130.

In the first stage 110, a sacrificial material from a fluid phase in contact with a surface 115 is chemically formed or adsorbed on the surface under conditions where the reaction or process is surface-limited. Therefore, the thickness of that material on the surface 115 is on the order of an atomic thickness and is not strongly dependent on reaction time or substrate thickness.

In one embodiment, the method bubbles dilute $H_2$ into the electrolyte, such as sulfuric acid (e.g., 0.1M $H_2SO_4$), to form surface hydride 112 on immersed palladium substrate 115. The sacrificial layer is a layer of hydride 112. It is a hydrogen atom H that is chemically bonded to the metal atom palladium on the surface. By nature, that can only be 1 atom thick. In one embodiment, when some metals are exposed to hydrogen gas, the layer of hydride is formed spontaneously.

Embodiments of the first stage 110 can be categorized by the change of oxidation state that occurs when forming the sacrificial material. Specifically, in one embodiment, the sacrificial material is formed by the adsorption of a reactive species without a change of oxidation state, such as the dissociative adsorption of hydrogen dissolved in a liquid or from the gas phase onto a metal surface, as described in FIG. 1.

In another embodiment, the sacrificial material is formed with deposition by chemical reduction, such as is obtained in electroless deposition. A chemical reducing agent, in combination with a metal ion that can react when mediated by the surface, converts metal ions to a metal layer on the surface. Proper conditions are selected, such as the reactivity or redox potential of the reducing agent, metal ion, and metal ligands, to ensure that the reaction is surface-limited. An example is the selective deposition of copper (Cu) onto noble metal substrates in the presence of the ferricyanide/ferrocyanide redox couple, as described in FIG. 12 below. In yet another embodiment, the sacrificial material is formed with deposition by chemical oxidation, such as by reaction of solution-phase borohydride with a surface to form a surface hydride layer and borates or other oxidation products in solution.

Once the hydride layer 112 is formed, in the second stage 120, the sacrificial material 112, in contact with a liquid or similar condensed phase with mobile atomic-scale species (gel, paste, supercritical fluid, etc.), then undergoes a galvanic exchange reaction, so the sacrificial material 112 is oxidized away by another material that is reductively deposited in its place. In one embodiment, the method stops exposing the palladium substrate 115 to hydrogen gas and adds a dissolved rhodium (Rh) salt that will react with the hydride 112 and form a rhodium layer 135 on the surface 115, as illustrated in the third stage 130. In one embodiment, doses of rhodium(III) chloride solution are introduced to replace 3H with rhodium during the second stage 120. The +3 charge of rhodium means it would have to react with 3 of the surface H atoms to form 3 H+ ions for every rhodium atom that is deposited. After that reaction is complete, in one embodiment, a layer of rhodium 135 is formed from surface hydride.

The three stages 110, 120, and 130 can be repeated. For example and in one embodiment, the method exposes the palladium substrate 115, with a rhodium layer 135 formed on top of it, to hydrogen. The hydride layer can form on either any exposed palladium substrate 115 or the surface rhodium 135 to form a new sacrificial layer of hydride. The new hydride layer can react with rhodium ions to form a new rhodium layer. The cycle can repeat for multiple iterations. So the method can grow an arbitrarily thick layer on the palladium substrate 115. One of ordinary skill in the art would recognize that other relatively noble metals, such as ruthenium and platinum, can also be used in place of palladium or rhodium to perform this ALD process.

The first stage 110 is to be contrasted with the analogous step in electrochemical atomic layer deposition, in which the sacrificial material is formed by electrochemical reduction, which requires electrical contact from the surface to an external electrical power supply. In electroless atomic layer deposition, the chemical driving force for formation of the surface layer is present in a liquid or similar condensed phase in contact with the surface, so external electrical contact is not needed, and deposition onto loose powders or isolated seed layers on insulating substrates is possible. The method is to be contrasted with conventional atomic layer deposition in that the second stage 120 and often the first stage 110 are performed in a liquid or similar condensed phase, and do not require elevated temperatures to vaporize or chemically decompose reactants. Electroless atomic layer deposition can thus be performed on materials where the layers or substrates cannot withstand elevated temperature.

Figure 2:
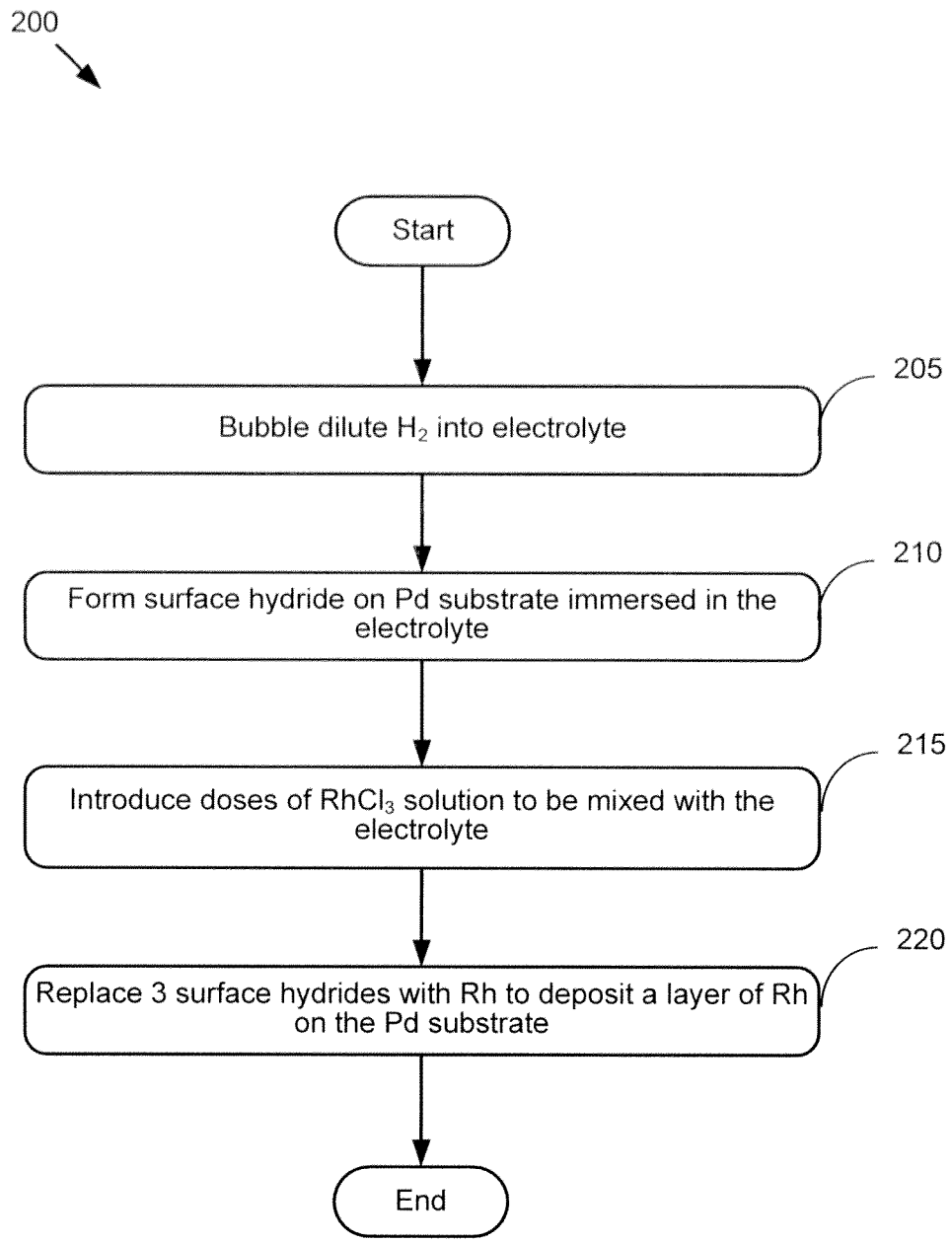
FIG. 2 is a flowchart of a single step of electroless atomic layer deposition in accordance with one embodiment of the present invention.

FIG. 2 is a flowchart of a single step of electroless ALD in accordance with one embodiment of the present invention. Specifically, this figure describes a process 200 that represents a single step of using surface hydride as sacrificial layer in performing iterative ALD. In one embodiment, the process 200 corresponds to the three stages described in FIG. 1 above. As shown in FIG. 2, the process 200 begins by bubbling (at block 205) dilute $H_2$ into an electrolyte, such as sulfuric acid (e.g., 0.1M $H_2SO_4$), in which the Pd substrate (e.g, Pd coated substrate) is disposed.

At block 210, the process 200 forms surface hydride on palladium substrate immersed in the electrolyte. In one embodiment, the blocks 205 and 210 are performed simultaneously and correspond to the stage 110 described in FIG. 1 above.

At block 215, the process 200 introduces doses of $RhCl_3$ solution to be mixed with the electrolyte. At block 220, the process 200 replaces 3 surface hydrides with rhodium to deposit a layer of rhodium on the palladium substrate. In one embodiment, the blocks 215 and 220 correspond to the stage 120 described in FIG. 1 above. The process 200 then ends. In one embodiment, the process 200 repeats multiple times in order to deposit multiple layers of metals onto the palladium substrate.

One of ordinary skill in the art will recognize that the process 200 is a conceptual representation of the operations used to perform a single step of electroless ALD. The specific operations may not be performed in one continuous series of operations, and different specific operations may be performed in different embodiments.

Figure 3:
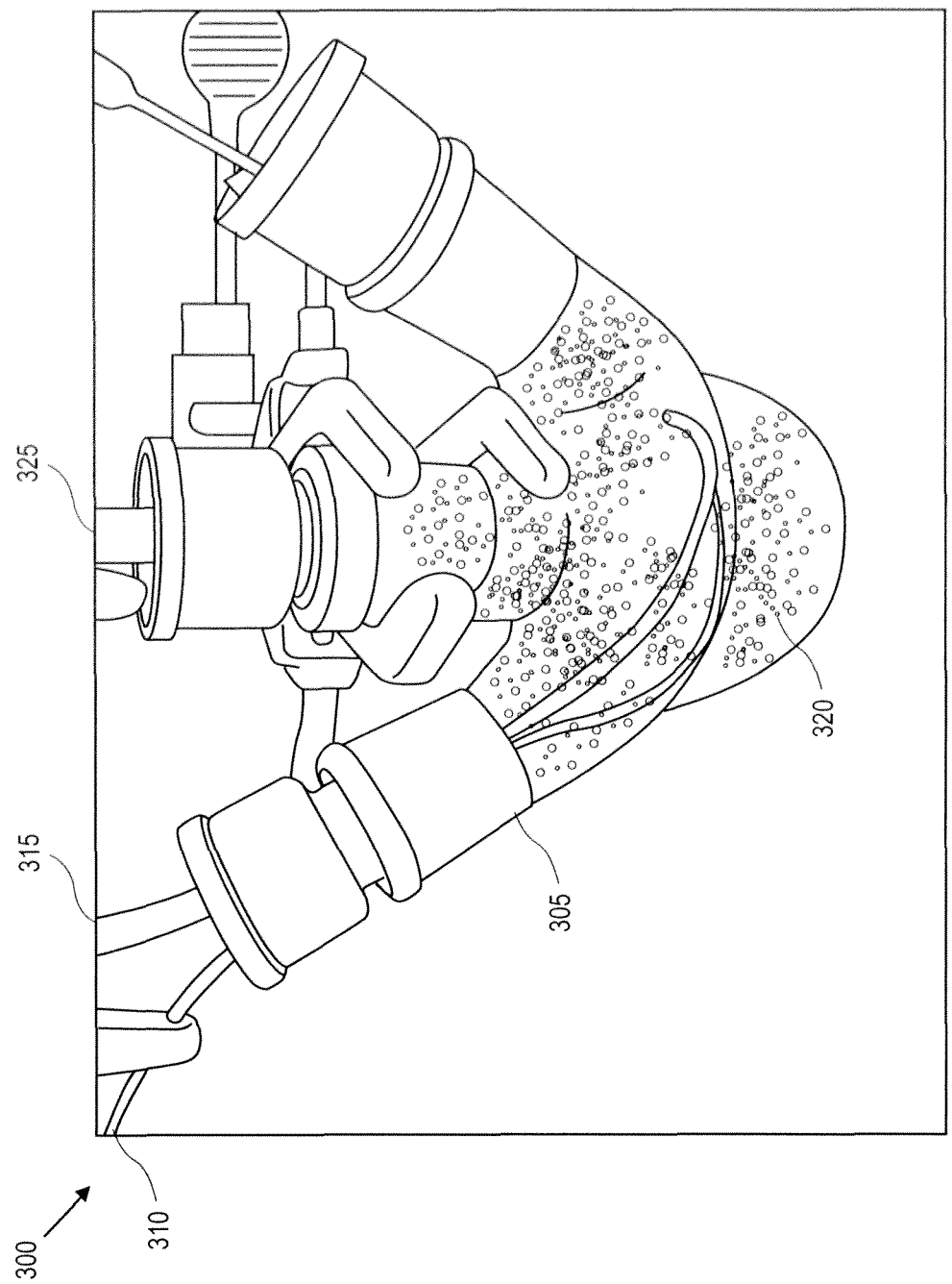
FIG. 3 shows a chemical reactor for performing the electroless atomic layer deposition in accordance with one embodiment of the present invention.

FIG. 3 shows the chemical reactor 300 for performing the electroless ALD in accordance with one embodiment of the present invention. In one embodiment, the chemical reactor 300 is used to perform the processes described in FIGS. 1 and 2 above. As illustrated, the chemical reactor 300 includes a container 305, a test electrode 310, a gas bubbler 315, a stirred powder 320, and a reference electrode 325. In one embodiment, the container 305 initially contains electrolyte and the stirred powder 320.

In one embodiment, the test electrode 310 and reference electrode 325 are immersed in the solution and connected to a voltmeter to monitor the voltage that is generated effectively by the chemical reactions in the chemical reactor 300. When hydrogen gas is put into the chemical reactor 300 through the gas bubbler 315, the hydrogen gas reacts with the substrate, which is the palladium surface of the stirred powder 320. The reaction changes the voltage between that test electrode 310 and the reference electrode 325. The voltage between that test electrode 310 and the reference electrode 325 is monitored to determine whether that hydrogen reaction has gone to completion. Once the hydrogen reaction has completed and a metal salt is added into the solution, the voltage between that test electrode 310 and the reference electrode 325 can be used to monitor whether that replacement reaction of the metal for the hydride has gone to completion.

In one embodiment, the stirred powder 320 is a powder of a noble metal, such as palladium. In one embodiment, the electrolyte is a solution of 0.1M $H_2SO_4$. In one embodiment, the metal salt added into the chemical reactor 300 is $N_2$-purged aliquots containing 13 mM $RhCl_3$. One of ordinary skill in the art would recognize that, instead of using metal powders as the substrate, other materials, such as films, matrix-supported nanoparticles, metals patterned onto insulators, and 3D structured materials can also be used as the substrate.

Figure 4:
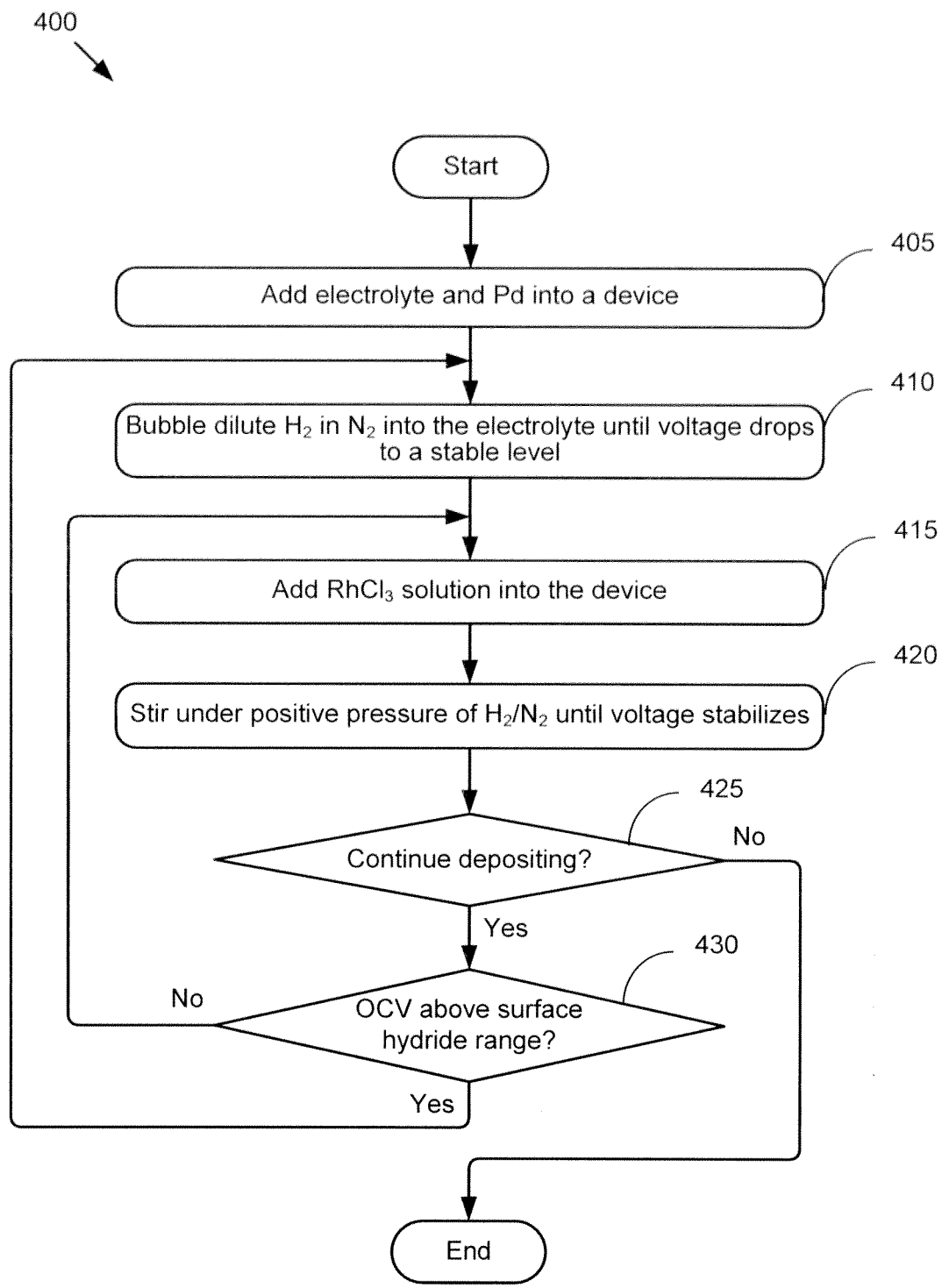
FIG. 4 is a flowchart of the detailed process of the electroless atomic layer deposition in accordance with one embodiment of the present invention.

FIG. 4 is a flowchart of the detailed process of electroless ALD in accordance with one embodiment of the present invention. Specifically, this figure describes a process 400 that uses surface hydride as sacrificial layer in performing iterative ALD. In one embodiment, the process 400 corresponds to the three stages described in FIG. 1 above. As shown in FIG. 4, the process 400 begins by adding (at block 405) electrolyte and palladium into a device. In one embodiment, the electrolyte is 13 mL 0.1M $H_2SO_4$ and the palladium is 200 mg (1.89 mmol) $Pd^0$. In one embodiment, the device is the chemical reactor described in FIG. 3 above.

At block 410, the process 400 bubbles dilute $H_2$ in a nonreactive gas (e.g., $N_2$) into the electrolyte until voltage drops to a stable level. In one embodiment, the process 400 first bubbles with $N_2$ and stirring for about 15 minutes, then switches from $N_2$ to 1% $H_2$ in $N_2$. In one embodiment, the process 400 records a voltammogram of a test palladium electrode after a certain step, such as 405. In one embodiment, the process 400 bubbles for about one hour until the open circuit voltage (OCV) drops to about −0.2 V versus a silver/silver chloride reference electrode, which is considered as the stable level. In one embodiment, the block 410 corresponds to the stage 110 described in FIG. 1 above.

Exposure of a suspension of Pd powder in electrolyte to hydrogen/nitrogen gas mixtures has several consequences: i) reduction of surface oxide, ii) formation of a surface hydride due to the large enthalpy of chemisorption, iii) formation of bulk, α-phase palladium hydride ($PdH_\alpha$), and iv) dissolution of a low concentration of hydrogen gas in the electrolyte. By controlling the partial pressure of $H_2$ in the gas mixture, the formation of palladium hydride can be precisely tuned, due to the well characterized solubility of H in Pd. For example, at 30° C., the maximum solubility of $PdH_\alpha$ is 0.015 H/Pd, and this value is reached at 2.4 kPa of $H_2$ pressure. The solubility of hydrogen in aqueous electrolytes is on the order of 10 micromolar at this pressure and temperature. Under many practical conditions, especially deposition onto films and fine powders, the amount of hydride in the bulk Pd or dissolved in the electrolyte is less than or similar to the amount on the surface. Atomic layer deposition of metals can then be carried out by exposing the hydrided powder to the corresponding metal ions in solution.

The partial pressure of hydrogen gas is one factor in controlling the amount of bulk $PdH_\alpha$ formed during charging. Even at extremely low $H_2$ pressure, the surface hydride can still form, providing electrons to reduce the second material, which will be introduced at block 415 below. $PdH_c$, dissolved in the bulk would then replenish the surface hydride until exhausted.

At block 415, the process 400 adds $RhCl_3$ solution into the device to be mixed with the electrolyte. In one embodiment, the $RhCl_3$ solution is a 0.1 or 0.25 mL dose of $N_2$-purged 13 mM $RhCl_3$.

At block 420, the process 400 stirs under positive pressure of $H_2/N_2$ until voltage stabilizes. In one embodiment, there is minimal gas flow in both block 415 and block 420 (no bubbling, but positive pressure to prevent ingress of air). In one embodiment, it takes several minutes for the voltage to stabilize. Once the voltage stabilizes, a layer of rhodium is deposited on the palladium substrate. In one embodiment, the blocks 415 and 420 correspond to the stage 120 described in FIG. 1 above.

Since deposition of a single monolayer (ML) of Rh atoms at the surface of Pd metal by reduction of $Rh^{3+}$ ions requires three equivalents of PdH, each cycle of hydride formation and metal ion addition under these conditions would provide reducing equivalents necessary for deposition of 1.4 to 1.6 ML. This includes electrons from the surface hydride and $PdH_\alpha$ dissolved in the bulk, both of which form during block 420. It should be noted that the partial pressure used in this example is close to the upper limit that is advisable in this system at room temperature. Powder exposed to >2.4 kPa of $H_2$ would undergo transformation to β-phase palladium hydride ($PdH_\beta$), with a corresponding increase in volume, complicating the deposition process. Reducing equivalents that are stoichiometric or substoichiometric, or deposition on lower surface area materials, could be achieved with a lower partial pressure of $H_2$, at the possible expense of reaction kinetics. Increasing temperature, which increases the pressure at which transition to $PdH_\beta$ would occur, would allow a higher concentration of $PdH_\alpha$ in the bulk, which might be necessary for deposition on higher surface area powders such as matrix-supported nanoparticles.

At block 425, the process 400 determines whether to continue depositing. If the choice is made to continue depositing, the process determines (at block 430) whether the OCV is above palladium surface hydride range. If the OCV is above palladium surface hydride range, the process 400 loops back to block 410 to bubble more dilute $H_2$ in $N_2$ into the electrolyte. If the OCV is not above the range indicating presence of surface hydride on the substrate, the process 400 loops back to block 415 to add more $RhCl_3$ solution into the device. If the process 400 determines (at block 425) that no more depositing is needed, the process 400 ends.

One of ordinary skill in the art will recognize that the process 400 is a conceptual representation of the operations used to perform electroless ALD. The specific operations may not be performed in one continuous series of operations, and different specific operations may be performed in different embodiments. In another embodiment, a sample is alternately removed from solution and exposed to the dilute hydrogen mixture with no liquid in contact with the sample to form the sacrificial hydride layer, and then immersed in the solution containing the metal salt that galvanically exchanges for the hydride layer, repeating cycles of this pair of steps until the desired thickness is obtained.

The process 400 demonstrates a strategy for electroless atomic layer deposition of Rh metal on Pd powder. In another embodiment, platinum is deposited by substituting a platinum(II) chloride salt such as potassium tetrachloropalladate for the $RhCl_3$ indicated in 415. This process is carried out by suspending the powder in an electrolyte solution and cycling between chemical hydride formation using hydrogen gas, and addition of salts of the alloying metal. As the number of cycles increases, the thickness of surface coverage increases. The cell potential during the reaction can be monitored using a Pd wire test electrode. Changes to the cyclic voltammetry of this test electrode demonstrate kinetic enhancement of hydride desorption after formation of a surface layer of the second metal. Furthermore, differences in product distribution when different surface-modified powders are used as catalysts for hydrogenation of phenylacetylene (PA) are observed. This technique could be widely applied to take advantage of enhanced catalytic properties of the surface layers. It requires no specialized equipment, makes use of benign reagents, and can be carried out in a typical synthetic laboratory under ambient conditions. This technique is not confined to an electrode or film, making it a highly scalable complement to other strategies for atomic layer deposition and suitable for complex threedimensional structures. This technique can be applied to high-surface area noble metals (such as palladium or platinum) and matrix-supported nanoparticles for use as catalysts.

Figure 5:
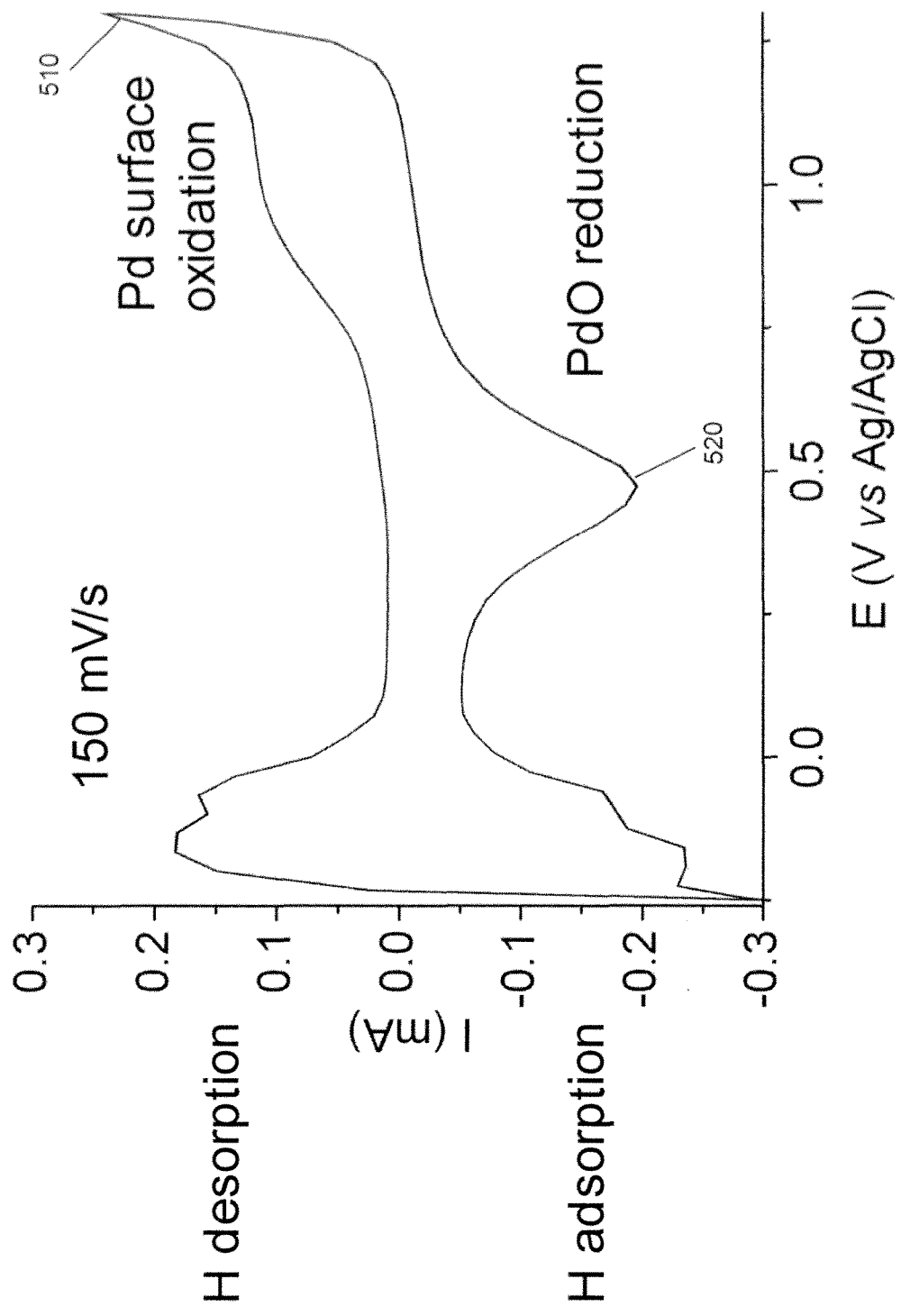
FIG. 5 shows cyclic voltammetry of the test wire before atomic layer deposition in accordance with one embodiment of the present invention.

FIG. 5 shows cyclic voltammetry (CV) of the test wire before ALD in accordance with one embodiment of the present invention. In one embodiment, the CV results are measured before the reactions described in FIGS. 1, 2, and 4 above occur to see the chemical properties of the palladium powder at that time. In this particular experiment, the voltage is changed at a rate of 150 mV/s. When the voltage is changed, various electrochemical reactions occur at the palladium surface, causing the current to change accordingly.

This CV experiment is intended to measure how the powder behaves before the chemical layers are applied. When the chemical layers are applied, both the metal oxidation features and the hydrogen absorption features of the powder will change. As illustrated in FIG. 5, significant positive current occurs at 510, indicating palladium surface oxidation, and a peak 520 of negative current indicating PdO reduction.

Figure 6:
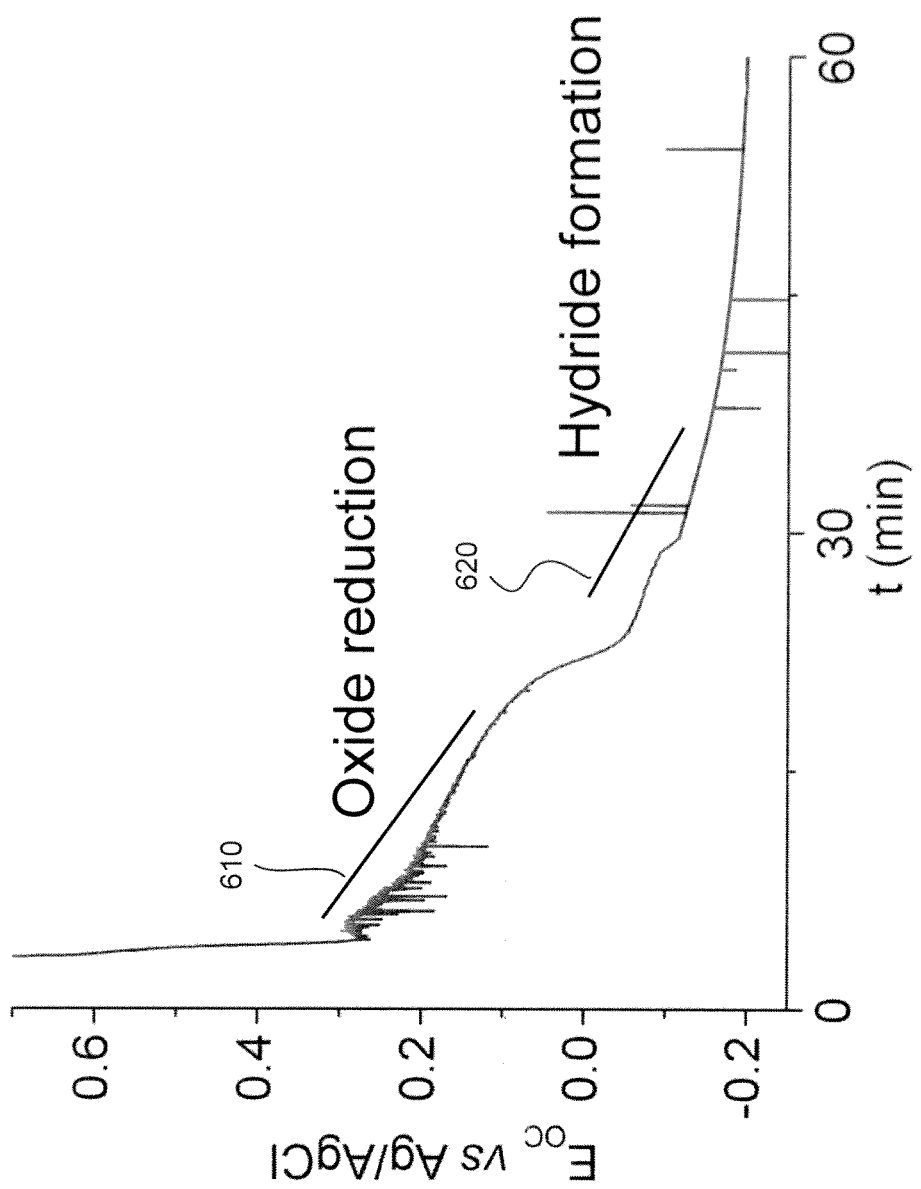
FIG. 6 shows how the voltage of the test electrode changes with time as dilute hydrogen gas is bubbled into the electrolyte in accordance with one embodiment of the present invention.

FIG. 6 shows how the voltage of the test electrode changes with time as dilute hydrogen gas is bubbled into the electrolyte in accordance with one embodiment of the present invention. In one embodiment, this voltage change corresponds to stage 110 described in FIG. 1 above. In FIG. 6, the chemical reaction for charging the palladium with surface hydride and $PdH_\alpha$ is started as the powder in the reactor is exposed to hydrogen gas. As illustrated, in one embodiment, at 0 minutes, purge gas is switched from $N_2$ to 1% $H_2$ in $N_2$. In one embodiment, when the purge gas is under room temperature, the percentage of $H_2$ in $N_2$ can range from 0.01 to 2.5 in order to form the sacrificial hydride. However, one with ordinary skill in the art would recognize that the optimal percentage of $H_2$ in $N_2$ can change if the reaction takes place in a different temperature range or different metal is being processed.

When the hydrogen starts to bubble in, there is a small amount of oxide left on the surface. So it takes some time for the hydrogen gas to react with that surface oxide. Therefore, as illustrated in FIG. 6, the voltage starts high, and then it drops and stays at around 0.2 volts for about 15 minutes after the hydrogen reacts with the surface oxide, as indicated by the oxide reduction section 610. And then eventually, the surface oxide is completely removed by the hydrogen, and the voltage starts to decrease. The voltage decreases into the −0.1 to −0.2 range, which is the range in which the surface hydride forms and the proscribed amount of $PdH_\alpha$ dissolves in the bulk Pd, as indicated by the hydride formation section 620. Then the voltage stabilizes at about −0.2.

Figure 7:
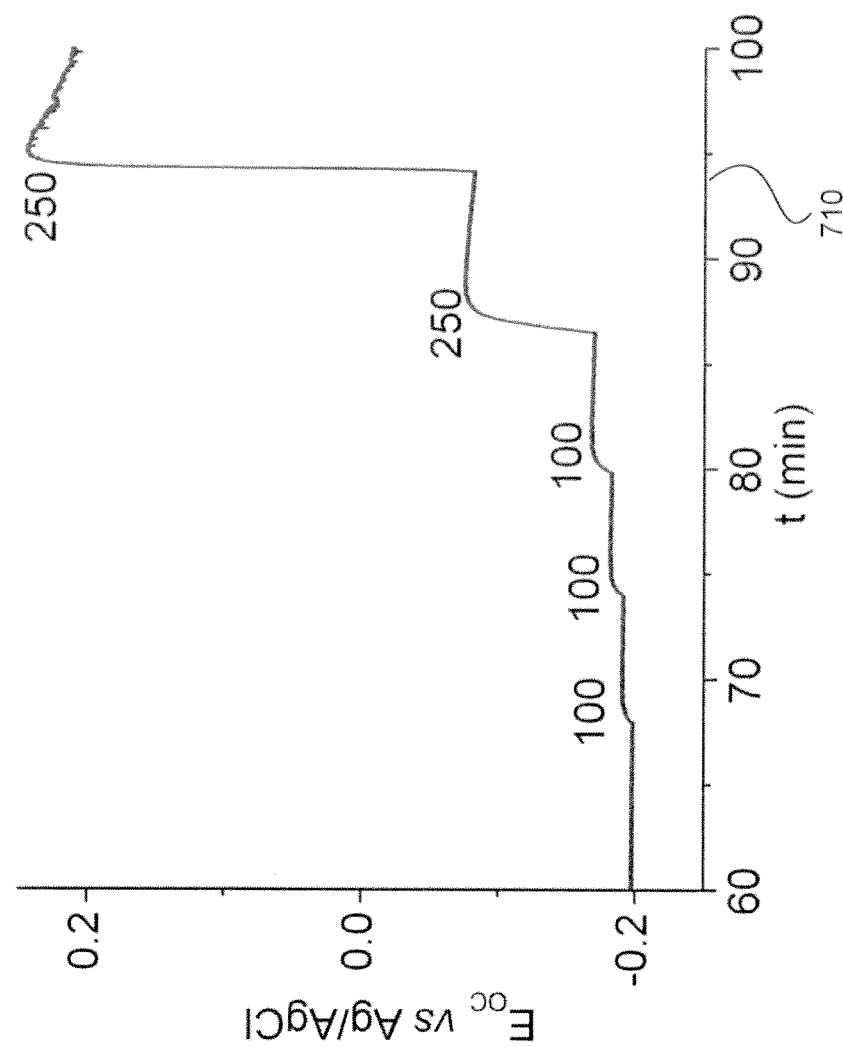
FIG. 7 shows how the voltage of the test electrode changes with time as metal salt solution is added in accordance with one embodiment of the present invention, with numerical labels indicating the volume of solution added in microliters.

FIG. 7 shows how the voltage changes with time as metal salt is added in accordance with one embodiment of the present invention. In one embodiment, this voltage change corresponds to stage 120 described in FIG. 1 above. In one embodiment, during this stage of experiment, the experiment described in FIG. 6 above is completed, the bubbling is stopped, and doses of metal salt solution are injected with stirring. The metal salt, such as $RhCl_3$, contains the metal for ALD and reacts with that surface hydride.

When all the surface hydride and $PdH_\alpha$ is consumed, the voltage increases. The presence of surface hydride produces a certain capacity for a reaction. Thus, the potential will be fairly stable as long as that surface hydride is present. Then, as soon as all of that surface hydride and $PdH_\alpha$ is consumed and more of the reactant metal salt is added, the potential will jump to a value far from the surface hydride range. As illustrated in FIG. 7, the potential stays fairly stable until time 710, at which time the potential starts to increase to a value greater than 0.2. That indicates that all the hydrogen that was put onto the metal has been consumed. It also signals that one cycle is done and the process can be repeated.

It is important in this embodiment not to add too much metal salt. It is desirable to have all of the metal salt used up before adding the hydrogen, so that there is a clean difference between the cycles, where one involves only reaction with hydrogen in the absence of metal salt, and the other is focused on the metal salt in the absence of significant amounts of $H_2$. This will ensure controlled growth, with one layer deposited at a time. In this example, the doses of metal salt are added gradually. It is important that the doses are smaller than or equal to the amount necessary to consume the surface hydride. If too much metal salt is added, one remedy is replacement of the electrolyte.

Figure 8:
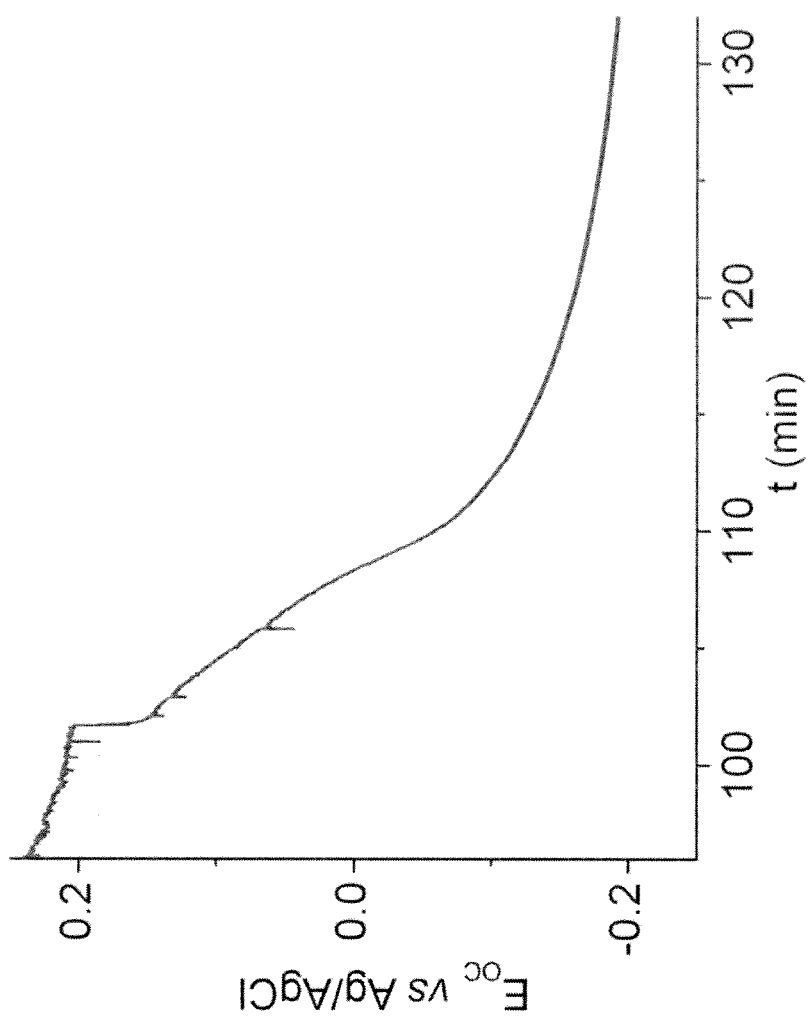
FIG. 8 shows how the voltage of the test electrode changes with time when repeating the process of bubbling hydrogen gas in accordance with one embodiment of the present invention.

FIG. 8 shows how the voltage changes with time when repeating the process of bubbling hydrogen gas in accordance with one embodiment of the present invention. This experiment is conducted after the experiments described in FIGS. 6 and 7 above have been completed and one layer of metal has been deposited. As illustrated in the figure, the voltage goes back down to about −0.2 as surface hydride forms again, similar to what is described in FIG. 6 above. There are some changes in curve shape compared to the curve in FIG. 6 because the metal deposited can modify hydride energy levels.

Figure 9:
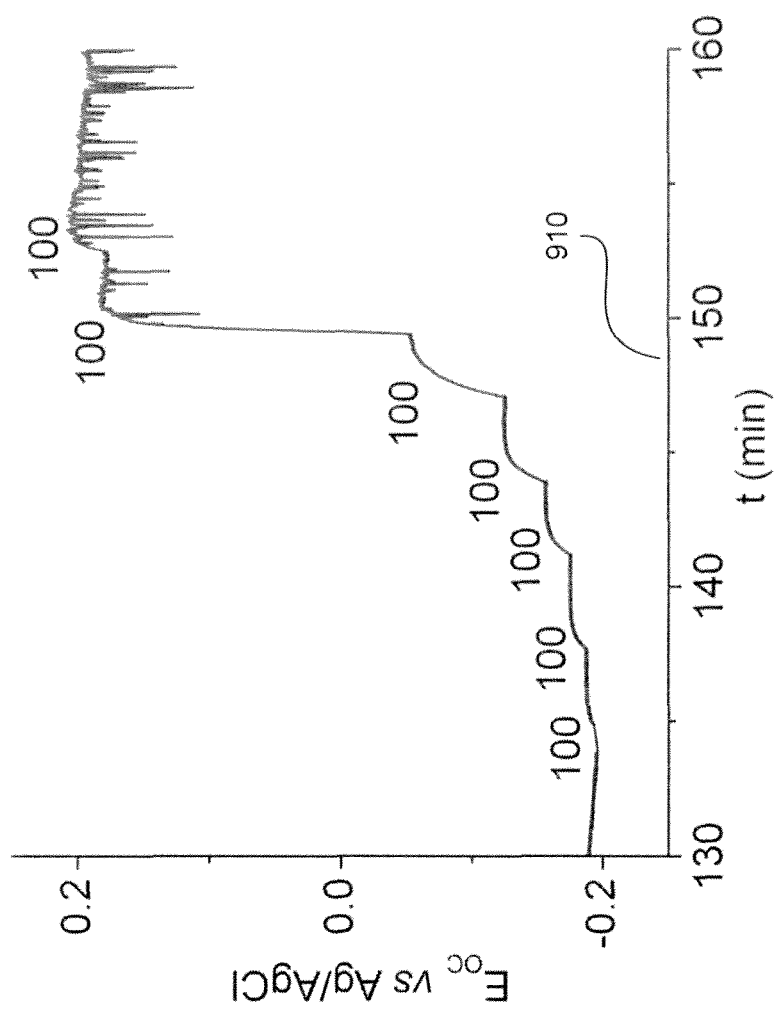
FIG. 9 shows how the voltage of the test electrode changes with time when repeating the process of adding metal salt in accordance with one embodiment of the present invention, with numerical labels indicating the volume of solution added in microliters.

FIG. 9 shows how the voltage changes with time when repeating the process of adding metal salt in accordance with one embodiment of the present invention. This experiment is conducted after the experiments described in FIGS. 6-8 above have been completed. As illustrated in FIG. 9, the electrode takes up a similar amount of metal salt; the voltage has a large jump at time 910 as the surface hydride is consumed. The voltage then plateaus, similar to what is described in FIG. 7 above. By the end of this experiment, essentially two layers of metal are added. Each cycle is expected to deposit 1.4 to 1.6 atomic layers of the metal by reducing the metal salt in solution with electrons from the surface hydride and $PdH_\alpha$. This process can be repeated for multiple cycles so that the amount of metal deposited to the surface can be controlled.

Figure 10:
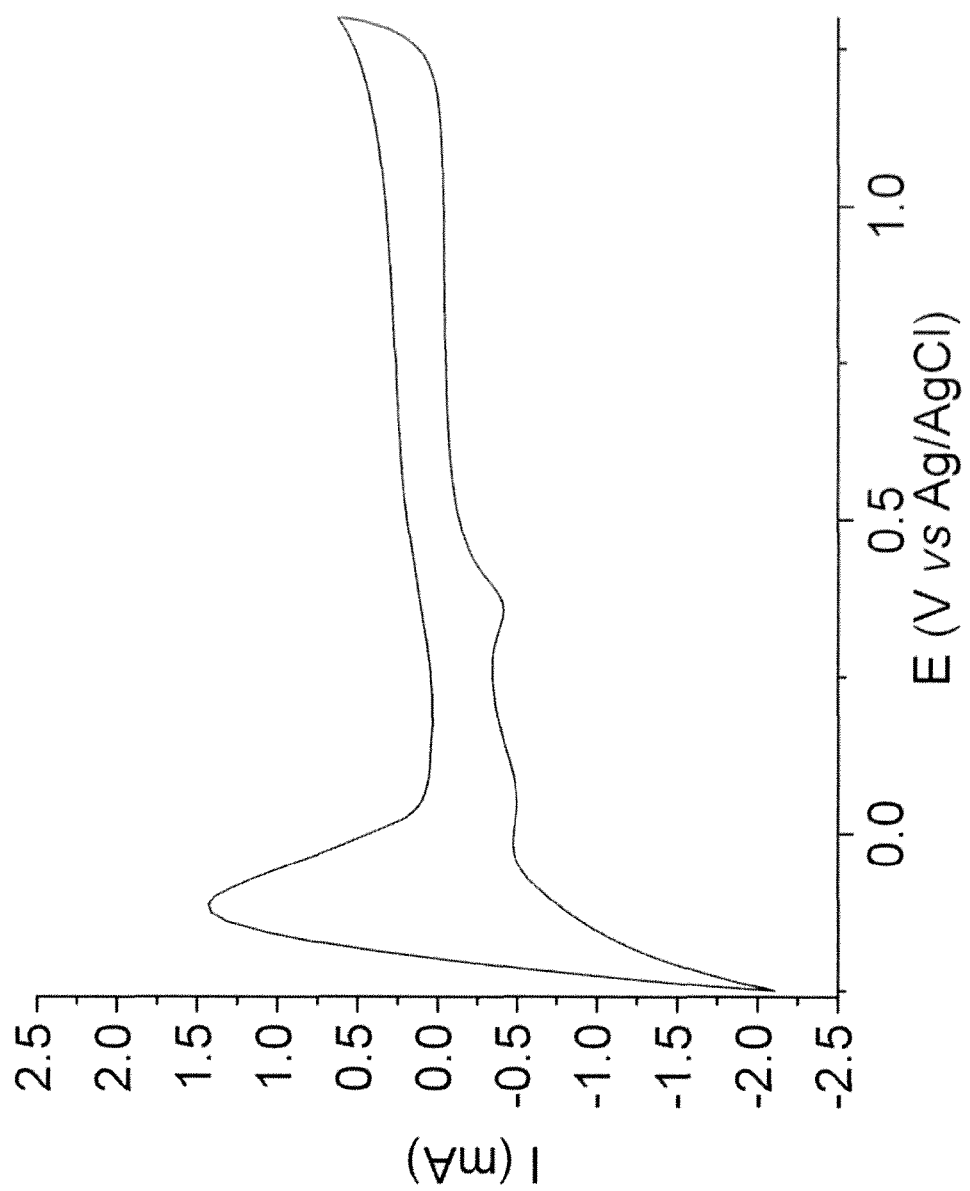
FIG. 10 shows cyclic voltammetry of the test wire after atomic layer deposition in accordance with one embodiment of the present invention.

FIG. 10 shows cyclic voltammetry of the test wire at 150 mV/s after ALD in accordance with one embodiment of the present invention. In one embodiment, the test wire length is not the same as FIG. 5. The potential cycling sweep described in FIG. 5 above is repeated to characterize the product after ALD. The CV results show that the product looks different from the reactant, as the curve shape is different from the one described in FIG. 5 above. In FIG. 5 above, there is a large palladium oxide reduction peak 510 at around 1 volt, and there is more structure in the way that the surface hydride formed below 0 volts. As illustrated in FIG. 10, that palladium oxide reduction peak is almost entirely absent. That suggests that the surface has mostly coated with another metal, e.g., rhodium. This also provides an indication that the potential at which the surface hydride forms has been changed. The surface energy of that hydride has been changed. The shape of the desorption curve has also changed. FIG. 10 shows that the surface chemistry has been changed by depositing the metal layer.

Figure 11:
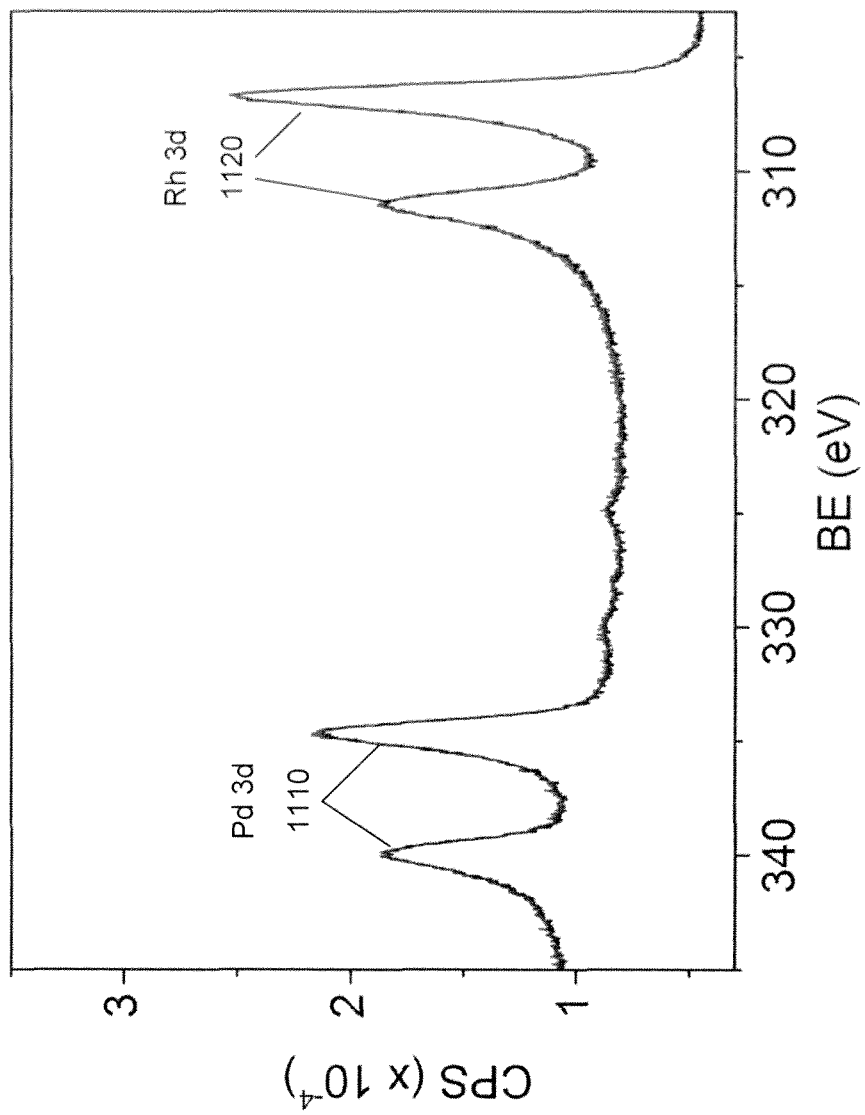
FIG. 11 shows X-ray photoelectron spectroscopy measurements of the product after the reaction for atomic layer deposition is completed in accordance with one embodiment of the present invention.

FIG. 11 shows X-ray photoelectron spectroscopy (XPS) measurements of the product after the reaction for ALD is completed in accordance with one embodiment of the present invention. The XPS measurements show the relative amount of different metals on the surface. As illustrated in the figure, the two peaks 1110 on the left side are characteristic of the palladium, and the two peaks 1120 on the right side are characteristics of the rhodium. This shows that rhodium has been deposited on the palladium substrate. Before the ALD reaction, the rhodium is totally absent.

An advantage of electroless hydride formation is that it does not require instrumentation that generates an electrical current proportional to the substrate surface area. Therefore, the electroless ALD is more scalable, or cheaper to perform. Using hydride as a sacrificial layer in metal electroless ALD is feasible because hydride forms easily at moderate potentials, is reactive toward formation of a new layer, and makes multiple cycles possible. Moreover, byproducts or unreacted residue during formation of the sacrificial layer is not a concern, making it easier to perform a batch process.

Figure 12:
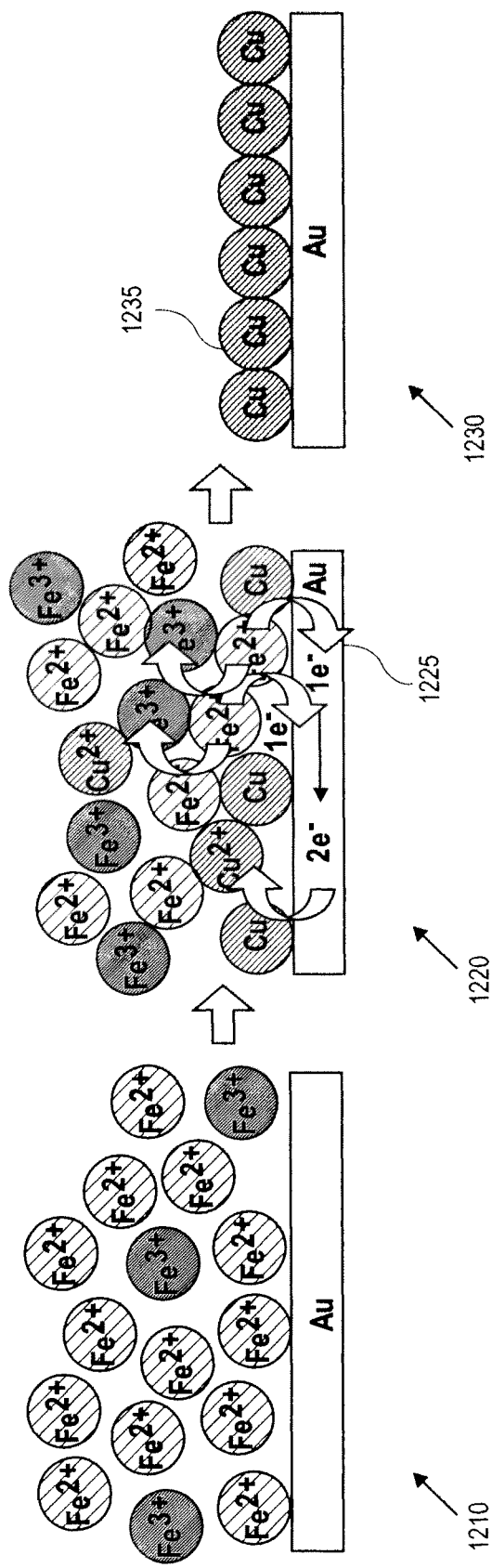
FIG. 12 illustrates chemically generating surface copper as a sacrificial layer for electroless atomic layer deposition in accordance with one embodiment of the present invention.

In electrochemical atomic layer deposition of metals, copper and lead are frequently used as the sacrificial layers, because they can be electrodeposited as an atomic layer at a voltage versus a reference electrode that is more positive than that required for deposition of multilayers of these metals. In some embodiments of electroless atomic layer deposition, instead of applying a voltage using electrical equipment to deposit the sacrificial layers, a similar chemical driving force is achieved through use of a redox couple or reducing agent that is capable of producing an open circuit potential versus the reference electrode that is close to that needed for deposition of the atomic layer. FIG. 12 illustrates chemically generating surface copper as sacrificial layer for electroless ALD in accordance with one embodiment of the present invention. Specifically, the method is illustrated through three stages 1210, 1220, and 1230. This method achieves a similar objective to stage 110 described in FIG. 1 above. However, instead of generating a surface hydride sacrificial layer, this method generates a surface copper sacrificial layer.

In the first stage 1210, in one embodiment, a mixture of ferrocyanide and ferricyanide is added into the electrolyte. In one embodiment, the concentration ratio of ferrocyanide and ferricyanide can be adjusted to adjust the open circuit potential so it is near the potential that would be used to deposit copper by electrochemical ALD, so that only one layer of copper will be deposited on the metal substrate. The open circuit potential can often be tuned within a range by changing the ratio of the oxidized and reduced species in a redox couple, or by changing the pH. In one embodiment, a 10:1 ratio of ferrocyanide to ferricyanide establishes a potential of about 0.16 volts versus a silver/silver chloride reference electrode, which is suitable for this purpose. In one embodiment, a 1:1 ratio of sodium ascorbate to ascorbic acid establishes a pH where this reducing agent produces a similar open circuit potential.

In the second stage 1220, copper salt is added. The ferrocyanide and ferricyanide are in constant equilibrium with the electrode 1225, giving electrons to the electrode and taking electrons out. That electrode 1225 is a metal substrate is that does not need to be electrically attached to a power source. In one embodiment, the electrode 1225 is gold (Au), as shown in this figure. One of ordinary skill in the art would recognize that the electrode 1225 could also be palladium or other metals. The ferrocyanide and ferricyanide establish an effective voltage inside the electrode 1225 that allows the copper to be selectively deposited as a monolayer 1235 on the surface of the electrode, as illustrated in the third stage 1230.

In one embodiment, during the three stages 1210, 1220, and 1230, the method immerses a gold substrate 1225 in an aqueous solution containing 100 mM sulfuric acid, 10 mM potassium ferrocyanide, 1 mM potassium ferricyanide, and 1 mM copper sulfate for 20 seconds to form an atomic layer, as can be shown by replacing the electrolyte with 100 mM sulfuric acid and electrochemically stripping the copper. In one embodiment, the best results are obtained in the absence of oxygen.

Figure 13:
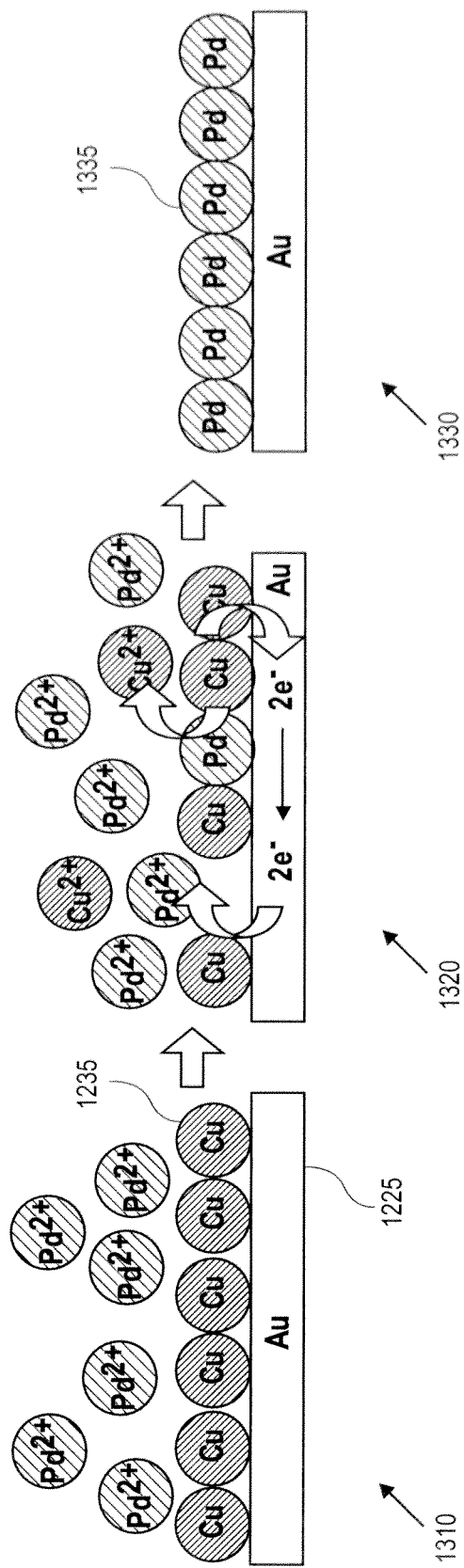
FIG. 13 illustrates using surface copper as sacrificial layer while performing electroless atomic layer deposition in accordance with one embodiment of the present invention.

Once the surface copper sacrificial layer is generated and the reactants are separated from the substrate (such as by replacing the electrolyte), a solution of palladium salt or other noble metal salt can be added to complete the electroless ALD cycle. FIG. 13 illustrates using surface copper as sacrificial layer in performing electroless ALD in accordance with one embodiment of the present invention. Specifically, the concept is illustrated through three stages 1310, 1320, and 1330.

In the first stage 1310, in one embodiment, the method adds a solution containing palladium salt. In the second stage 1320, the palladium salt reacts with the surface copper layer 1235 and forms a palladium layer 1335 on the gold substrate 1225, as illustrated in the third stage 1330. In one embodiment, the sample containing the metal substrate 1225 is immersed in an aqueous solution of 0.1 mM ammonium tetrachloropalladate and 50 mM hydrochloric acid. The copper layer 1235 is replaced by a palladium layer 1335, as can be verified by cyclic voltammetry of the sample in 100 mM sulfuric acid between −200 and +1200 mV versus a silver/silver chloride reference electrode, in which the characteristic palladium oxide reduction peak indicates presence of palladium. The processes described in FIGS. 12 and 13 can be repeated for multiple iterations, so the method can grow a palladium film on the substrate 1225 to a desired thickness.

One of ordinary skill in the art would recognize that other relatively noble metals, such as rhodium, ruthenium, silver, and platinum, can be used in place of palladium or gold to perform this ALD process.

In the description above, for the purposes of explanation, numerous specific details have been set forth in order to provide a thorough understanding of the embodiments. It will be apparent to one skilled in the art, however, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated in the figure to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description, various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A method of electroless atomic layer deposition, the method comprising:
- electrolessly generating a layer of sacrificial material on a surface of a first material immersed in an electrolyte under conditions where the process is surface-limited, wherein a thickness of the layer of sacrificial material is on an order of an atomic thickness and the sacrificial material comprises hydrogen and the method of generating a layer of sacrificial material on a surface of a first material comprises bubbling a 0.01% to 2.5% mixture of hydrogen in a nonreactive gas into an electrolyte;
- forming a layer of hydride on the surface of the first material as the layer of sacrificial material;
- constraining an amount of hydride in the first material so that the number of moles of hydride does not exceed the amount of surface hydride;
- adding doses of a solution of a second material; and
- performing a surface-limited galvanic exchange reaction to oxidize away the layer of the sacrificial material and deposit a layer of the second material on the surface of the first material.

2. The method of claim 1, wherein the electroless generating, adding, and performing the galvanic exchange are repeated for a plurality of iterations.

3. The method of claim 1, wherein the electroless generation of the layer of the sacrificial material comprises forming the layer of the sacrificial material without using an external electrical power supply.

4. The method of claim 1, wherein the galvanic exchange is performed in a liquid or a condensed phase with mobile atomic-scale species.

5. The method of claim 1, wherein the first material is palladium and the second material is rhodium, wherein the solution of the second material contains rhodium(III) halide.

6. The method of claim 5 further comprising stirring under a mixture of dilute $H_2$ in the nonreactive gas at a pressure that is positive with respect to ambient atmosphere, wherein there is minimal gas flow during the addition of the solution and the stirring.

7. The method of claim 1, wherein the second material is less easily oxidized than the first material.

8. The method of claim 1, wherein the first material is one of metal powders, films, matrix-supported nanoparticles, metals patterned onto insulators, and 3D structured materials.

* * * * *